(12) United States Patent
Roux

(10) Patent No.: US 6,919,573 B2
(45) Date of Patent: Jul. 19, 2005

(54) METHOD AND APPARATUS FOR RECYCLING GASES USED IN A LITHOGRAPHY TOOL

(75) Inventor: Stephen Roux, New Fairfield, CT (US)

(73) Assignee: ASML Holding N.V, Veldhoven (NL)

( * ) Notice: Subject to any disclaimer, the term of this patent is extended or adjusted under 35 U.S.C. 154(b) by 0 days.

(21) Appl. No.: 10/392,793

(22) Filed: Mar. 20, 2003

(65) Prior Publication Data

US 2004/0183030 A1 Sep. 23, 2004

(51) Int. Cl.⁷ .................................................. G21K 5/00
(52) U.S. Cl. ........................ 250/492.2; 250/493.1; 250/492.1
(58) Field of Search .................... 250/492.2, 504 R, 250/310, 306, 307, 493.1, 492.1; 438/401; 355/53; 378/119

(56) References Cited

U.S. PATENT DOCUMENTS

| | | | | |
|---|---|---|---|---|
| 4,866,517 A | * | 9/1989 | Mochizuki et al. | ......... 378/119 |
| 6,133,577 A | | 10/2000 | Gutowski et al. | |
| 6,341,006 B1 | | 1/2002 | Murayama et al. | |
| 6,376,329 B1 | * | 4/2002 | Sogard et al. | .............. 438/401 |
| 6,493,423 B1 | | 12/2002 | Bisschops | |
| 6,566,667 B1 | | 5/2003 | Partlo et al. | |
| 6,633,364 B2 | * | 10/2003 | Hayashi | ....................... 355/53 |
| 6,762,424 B2 | * | 7/2004 | Wester | .................. 250/504 R |
| 6,770,895 B2 | * | 8/2004 | Roux | ..................... 250/492.2 |
| 2001/0004104 A1 | | 6/2001 | Bijkerk et al. | |
| 2001/0055101 A1 | * | 12/2001 | Hayashi | ....................... 355/53 |
| 2002/0014598 A1 | | 2/2002 | Melnychuk et al. | |
| 2002/0084428 A1 | | 7/2002 | Visser et al. | |
| 2002/0088940 A1 | * | 7/2002 | Watanabe et al. | ........... 250/310 |
| 2004/0155205 A1 | | 8/2004 | Roux | ....................... 250/492.2 |

FOREIGN PATENT DOCUMENTS

| | | |
|---|---|---|
| EP | 0384754 A2 | 8/1990 |
| EP | 0826629 A2 | 3/1998 |
| EP | 1 098 226 A2 | 5/2001 |
| EP | 0 676 672 B1 | 6/2003 |

OTHER PUBLICATIONS

Copy of Danish Search Report for Singapore Appln. 200401292–8 mailed Dec. 9, 2004, 17 pages.

* cited by examiner

*Primary Examiner*—Frank G. Font
*Assistant Examiner*—Mary El-Shammaa
(74) *Attorney, Agent, or Firm*—Sterne, Kessler, Goldstein & Fox P.L.L.C.

(57) ABSTRACT

A system and method are used to recycle gases in a lithography tool. A first chamber includes an element that emits light based on a first gas. A second chamber uses the emitted light to perform a process and includes the second gas. The first and second gases converge between the two chambers, and at least one of the gases is pumped to a storage device. From the storage device, at least one of the two gases is recycled either within the system or remote from the system and possibly reused within the system. A gaslock can couple the first chamber to the second chamber. A gas source supplies a third gas between the first and the second gas in the gaslock, such that the first gas is isolated from the second gas in the gaslock. The first, second, and/or third gas can be pumped to the storage device and routed to the recycling device. The first, second, and/or third gas can be recycled for reuse to form the emitting light.

24 Claims, 6 Drawing Sheets

METHOD AND APPARATUS FOR RECYCLING GASES USED IN A LITHOGRAPHY TOOL

CROSS-REFERENCE TO RELATED APPLICATIONS

This application is related to U.S. application Ser. No. 10/300,898, filed Nov. 21, 2002, which is incorporated by reference herein in its entirety.

BACKGROUND OF THE INVENTION

1. Field of the Invention

The present invention relates generally to lithography systems. More particularly, the present invention relates to recycling gas used in a lithography tool.

2. Background Art

Lithography is a process used to create features (e.g., devices) on a surface of one or more substrates (e.g., semiconductor wafers, or the like). Substrates can include those used in the manufacture of flat panel displays, circuit boards, various integrated circuits, and the like. During lithography, the substrate is positioned on a substrate stage and is exposed to an image projected onto the surface of the substrate. The image is formed by an exposure system. The exposure system includes a light source, optics, and a reticle (e.g., a mask) having a pattern used to form the image. The reticle is generally located between the light source and the substrate. In extreme ultraviolet (EUV) or electron beam systems, the light source is housed in a light source vacuum chamber and the exposure system and substrate are housed in an optics vacuum chamber. The light source chamber and the optical chamber can be coupled via a gaslock.

In a lithography, feature (e.g., device) size is based on a wavelength of the light source. To produce integrated circuits with a relatively high density of devices, which allows for higher operating speeds, it is desirable to image relatively small features. To produce these small features, a light source is needed that emits short wavelengths of light (e.g., around 13 nm). This radiation is called EUV light, which is produced by plasma sources, discharge sources, synchrotron radiation from electron storage rings, or the like.

In some systems, utilizing a discharge plasma light source creates EUV light. This type of light source uses a gas or target material that is ionized to create the plasma. For example, the plasma-based light source can use a gas such as xenon. Then, the plasma is formed by an electrical discharge. Typically, the EUV radiation can be in the range of 13–14 nm. In other systems, EUV radiation is produced from laser produced plasma sources. In the laser produced plasma source, a jet of material (e.g., xenon, clustered xenon, water droplets, ice particles, lithium, tin vapor, etc.) can be ejected from a nozzle. A laser is spaced from the nozzle and emits a pulse that irradiates the jet to create the plasma. This plasma subsequently emits EUV radiation.

In order to produce a relatively large amount EUV light, a concentration of xenon must be relatively high where the plasma is being created (e.g., in the light source chamber). This produces a pressure that is too high for efficient transmission of the EUV light through the remainder of the system (e.g., the optics chamber). As a result, the path in which the EUV light travels must be evacuated. Usually, large vacuum pumps are used to remove the source gas as quickly as possible after it has performed its function of creating the EUV light. Unfortunately, at high machine throughput, a relatively large amount of source gas is pumped away. The cost of source gas such as xenon is substantial, and will result in a higher per wafer cost unless the source gas is recycled. Recycling the source gas is complicated by the inclusion of other gases being emitted from the remainder of the EUV lithography tool that mix with the source gas.

Accordingly, in some lithography tools the source gas is kept separate from gases in the remainder of the lithography tool by a very thin membrane. The membrane also removes unwanted radiation by functioning as a spectral filter. However, lithography tools having high throughput and high light intensity may not be able to have the membrane due to high thermal loading, which destroys the membrane. Thermal calculations show that the membrane would have to have a very large surface area to avoid vaporizing when the light source is turned on. A large surface, extremely thin membrane cannot be used in practice, even if they could be manufactured, due to their fragile nature. If the membrane is removed, a barrier between the source chamber and the rest of the tool is gone and gas mixing occurs, making the source gas recycling task extremely challenging, and in some cases completely impractical.

Therefore, what is needed is a system and method that efficiently recycles gases used in a lithographic system.

BRIEF SUMMARY OF THE INVENTION

Embodiments of the present invention provide a system including a first chamber including an element that emits light based on a first gas, a second chamber that uses the emitted light to perform a process and that includes a partial pressure of a second gas, or a partial pressure consisting of a mixture of gases, a pump used to pump at least the first gas into a storage device, and a controller used to route gas from the storage device to a recycling device.

Other embodiments of the present invention provide a method including (a) producing light with a first gas, (b) processing optics (e.g., cleaning, protecting, etc.) with a second gas, (c) pumping at least one of the first and second gases after steps (a) and (b) to a storage device, and (d) routing at least one of the first and second gases from the storage device to a recycling device.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

Figure 1:
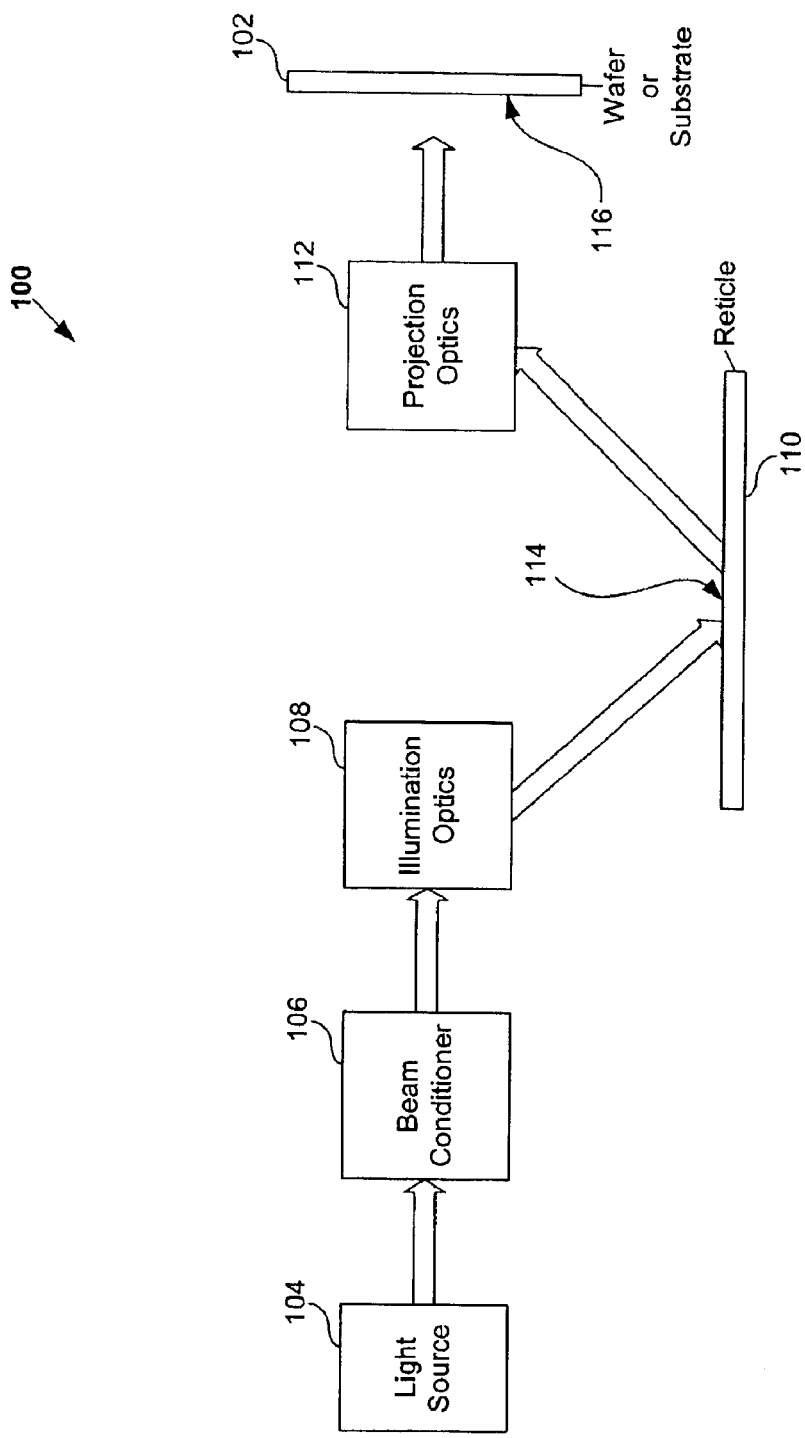
FIG. 1 shows a lithographic system, according to embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Overview

Embodiments of the present invention provide a system and method used to recycle gases in a lithography tool. A first chamber includes an element that emits light based on a first gas. A second chamber uses the emitted light to perform a process and includes the second gas. It should be understood that the pressure in these chambers is relatively low (i.e., near perfect vacuum), so the word 'gas' in this embodiment can refer to a partial pressure of gas found in this vacuum. The first and second gases converge between the two chambers, and at least one of the gases is pumped to a storage device. From the storage device, at least one of the two gases is recycled either within the system or remote from the system and possibly reused within the system. A gaslock can couple the first chamber to the second chamber. In such a gaslock, a gas source supplies a third gas between the first and the second gas in the gaslock, such that the first gas is isolated from the second gas in the gaslock. The first, second, and/or third gas can be pumped to the storage device and routed to the recycling device. The first, second, and/or third gas can be recycled for reuse.

System Having a Gaslock and a System that Recycles Gases

FIG. 1 shows a system 100 for forming a pattern on a wafer or substrate 102 according to embodiments of the present invention. A light source 104 (e.g., an EUV light source) emits a light beam that passes through a beam conditioner 106 and illumination optics 108 before being reflected from a reticle or mask 110. After reflecting from reticle or mask 110, the light beam passes through projection optics 112, which is used to transfer a pattern from a surface 114 of reticle or mask 110 onto a surface 116 of wafer or substrate 102. Other arrangements of these elements can be used without departing from the spirit and scope of the present invention.

Figure 2:
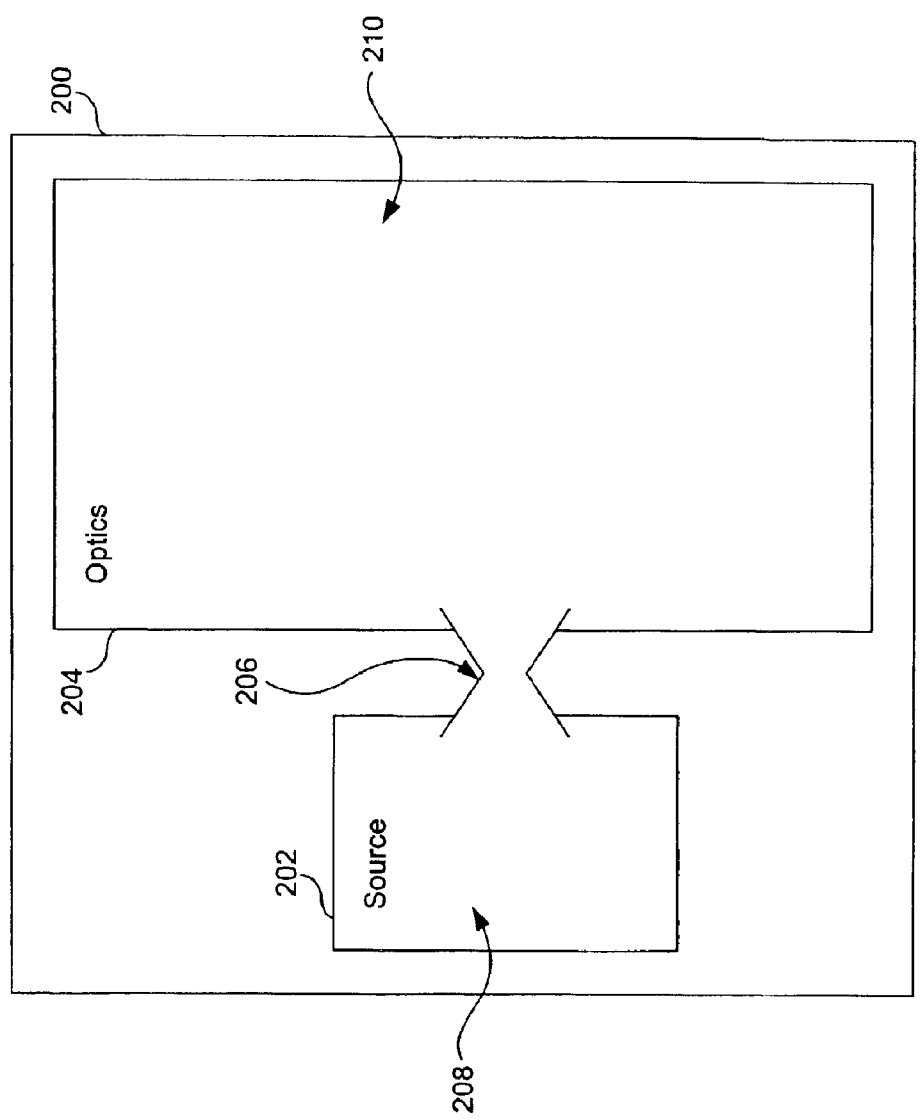
FIG. 2 shows a lithographic system, according to embodiments of the present invention.

FIG. 2 shows details of an exemplary system 200 according to an embodiment of the present invention. System 200 includes a first chamber (e.g., a light source chamber or vacuum light source chamber) 202 and second chamber (e.g., an optics chamber or optics vacuum chamber) 204. Second chamber 204 can include one or more of: a beam conditioner, illumination optics, a reticle, projection optics, and/or a wafer. First chamber 202 and second chamber 204 can be coupled via a gaslock 206. Basically, a gaslock is an area that allows first and second gases to remain isolated from one another based on a third gas flowing between them (e.g., forming a barrier between them), which suppresses mixing of the first and second gas or transfer of material from first chamber 202 to second chamber 204, or vice versa.

When a plasma-based light source is housed in first chamber 202, a first gas or other material 208 (e.g., xenon, lithium vapor, tin, krypton, water vapor, a metal target, or the like) is ionized to create the plasma, as discussed above. First gas 208 is only supplied to first chamber 202 during a time when light is being generated. At other times (e.g., during stand-by, idle, maintenance, or other modes), first chamber 202 is substantially in a vacuum state. Second chamber 204 includes a second gas (e.g., a process gases, such as helium, argon, hydrogen, nitrogen, or the like) 210. Second gas 210 can be used to reduce contamination in second chamber 204 and protect lithography tool mirrors located in second chamber 204. Similar to first gas 208, second gas 210 is only supplied to second chamber 204 during a time when cleaning or protection is required. At other times, second chamber 204 is substantially in a vacuum state. In this embodiment, a vacuum state is needed in chambers 202 and 204 to allow EUV light to be transmitted because EUV light has a substantially short wavelength (e.g., 13–14 nm), so it cannot readily pass through any substantial amount of gas, which usually absorbs the light. Thus, a vacuum state allows this wavelength of light to easily travel to and through second chamber 204.

Figure 3:
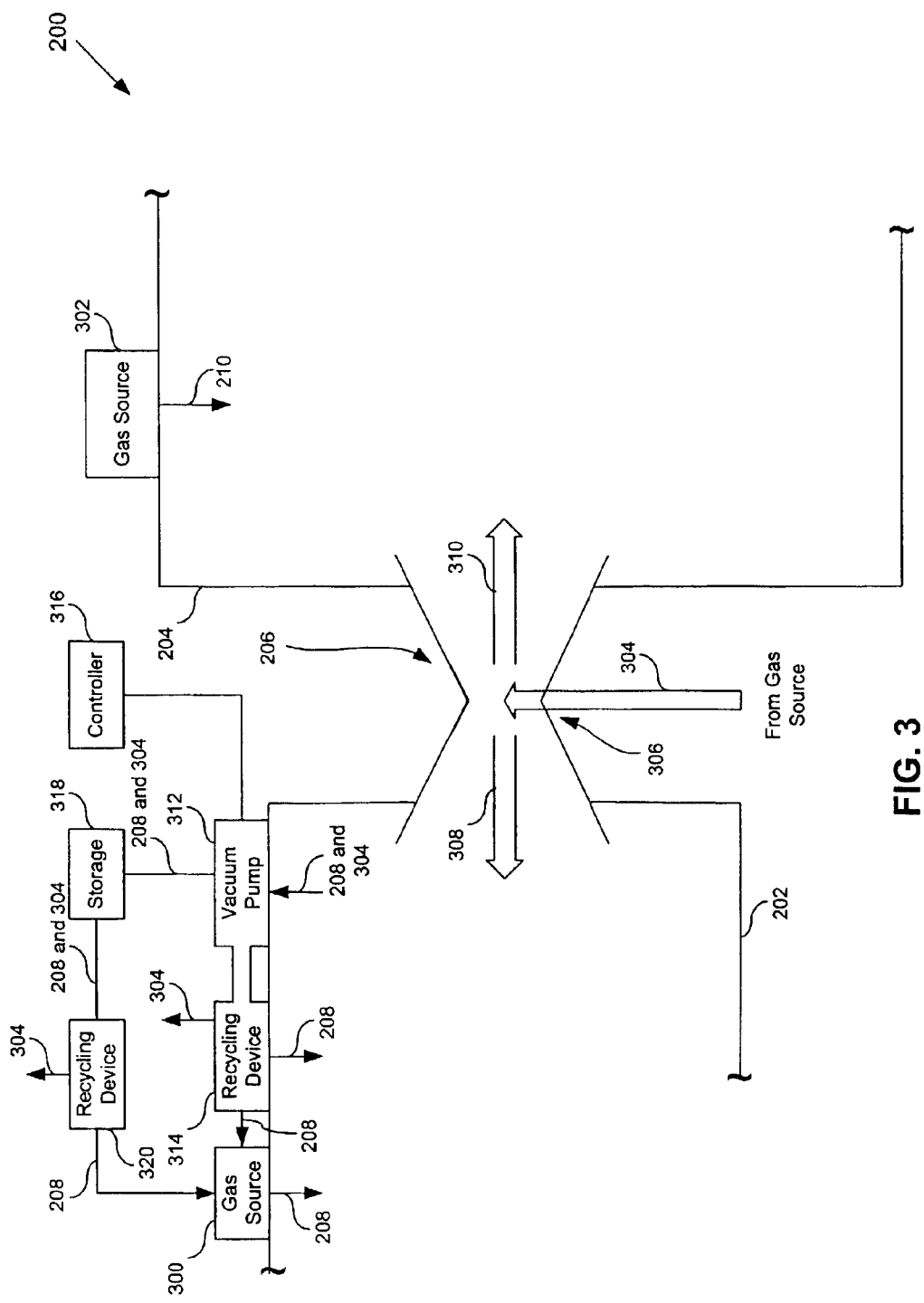
FIG. 3 shows gas flow through a gaslock in the lithographic system of FIG. 2.

FIG. 3 illustrates an interaction of gases in gaslock 206 according to embodiments of the present invention. First and second gases 208 and 210 are supplied to first and second chambers 202 and 204 via first and second gas sources 300 and 302. A third gas 304 (e.g., helium, neon, nitrogen, argon, etc.) is passed through an inlet 306 in gaslock 206 from a gas source (not shown). In an embodiment, third gas 304 can be continuously passed through an inlet in gaslock 206. Third gas 304 should be chosen so that it is easily separated from first gas 208 during a recycling device stage (e.g., a purifying and recycling stage), as discussed below. By purifying and recycling first gas 208, system 200 of the present invention reduces costs over conventional systems that must discard first gas 208 (and/or second gas 210 and/or third gas 304) after its initial use because first gas 208 mixes with second gas 210. Discarding of first gas 208 requires a new supply of first gas 208 each time light is generates, which makes up substantial amount of the running expense of the tool.

The flow of third gas 304 forces molecules of first gas 208 to travel in a direction of arrow 308. Similarly, the flow of third gas 304 forces molecules of second gas 210 to travel in a direction of arrow 310. Thus, the flow of third gas 304 isolates first gas 208 from the second gas 210. In an embodiment, first gas 208 and third gas 304 are pumped from first chamber 202 using a pump (e.g., a vacuum pump) 312. Then, first gas 208 is separated from third gas 304 in recycling device 314, such that first gas 208 can be reused to form the emitted light. For example, third gas 304 can be chosen to have a freezing point (e.g., minus 60° C.), which is substantially above a freezing point (e.g., –200° C.) of first gas 208. Then, third gas 304 is frozen, separated from first gas 208, and removed from recycling device 314. In various embodiments, first gas 208 can either be reused directly from recycling device 314 or transmitted to gas source 300.

In an alternative embodiment, controller 316 can be used to send first gas 208 and third gas 304 to storage 318, which can be internal or external to system 200 or a location holding system 200. A recycling device 320 can be coupled between storage 318 and gas source 208 and/or a gas source emitting third gas 304. Recycling device 320 can function similar to recycling device 314. In an embodiment where recycling device 320 is "off-site," storage 318 can either be moved to the "off-site" location or the gasses can be removed from storage 318 and brought to the "off-site" location. It is to be appreciated that in various embodiments third gas 304 can be reused after exiting recycling device 314 or 320 or it can be discarded. Also, although not shown, it is to be appreciated that second gas 210 can also be recycled using similar or functionally similar devices, as is known in the art.

System with No Gaslock that Recycles Gases

Figure 4:
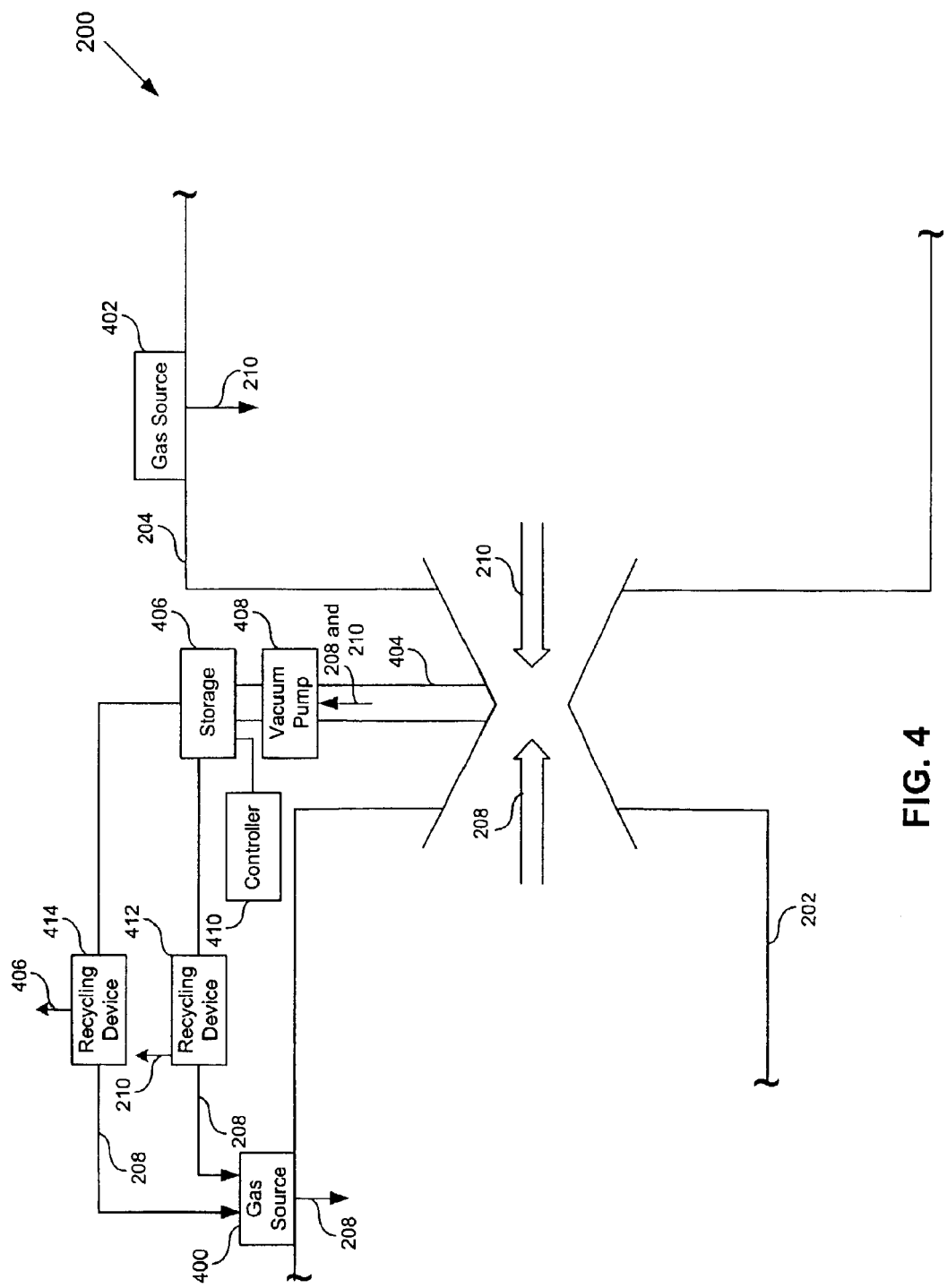
FIG. 4 shows a lithographic system, according to embodiment of the present invention.

FIG. 4 shows a section of system 200 that does not include a gas lock according to an embodiment of the present invention. In this embodiment, no third gas is added where first gas 204 and second gas 210 converge. First and second gases 208 and 210 are supplied to first and second chambers 202 and 204 via first and second gas sources 400 and 402. Both gases are removed from an area in which they converge through a conduit 404 to a storage device 406 using a vacuum pump 408. Then, based on controller 410, the gases are either recycled within system 200 using recycling device 412 or outside system 200 using recycling device 414. Both recycling device 412 and 414 can function similar to recycling device 314 as described above. If first and second gases 208 and 210, respectfully, are recycled "off-site" using recycling device 414, either storage 406 is transported to recycling device 414 or first and second gases 208 and 210, respectfully, are withdrawn from storage 406 into anther container to be transported to recycling device 414. Recycling can take place similar to the processes described above. Although first gas 208 is most like reused, second gas 210 can either be discarded or routed back to supply 402 because it is normally a less expensive gas.

A dramatic cost savings can result from recycling and reusing the first, second, and/or third gases. This is because a large portion of the expense of the manufacture of wafers can be supplying these relative expensive gases, especially in an EUV lithography system.

Methods for Recycling Gases Used in a Lithography System

Figure 5:
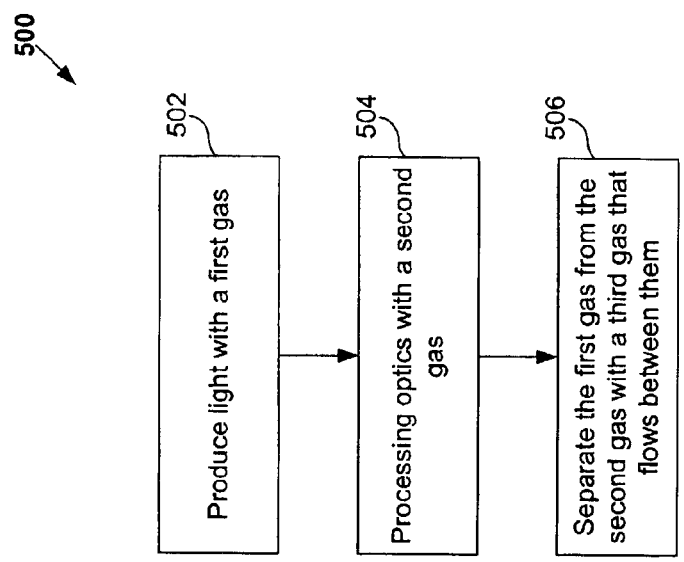
FIG. 5 shows a flowchart depicting a method according to an embodiment of the present invention.

FIG. 5 shows a flowchart depicting a method 500 according to an embodiment of the present invention. At step 502, light (e.g., extreme ultraviolet light) is produced with a first gas (e.g., xenon, lithium vapor, tin, krypton, and water vapor). At step 504, optics are processed (e.g., cleaned, protected, etc.) with a second gas (e.g., helium, argon, hydrogen, and nitrogen). At step 506, the first gas is separated (e.g., isolated) from the second gas with a third gas (e.g., helium, neon, and nitrogen, that flows between them.

Figure 6:
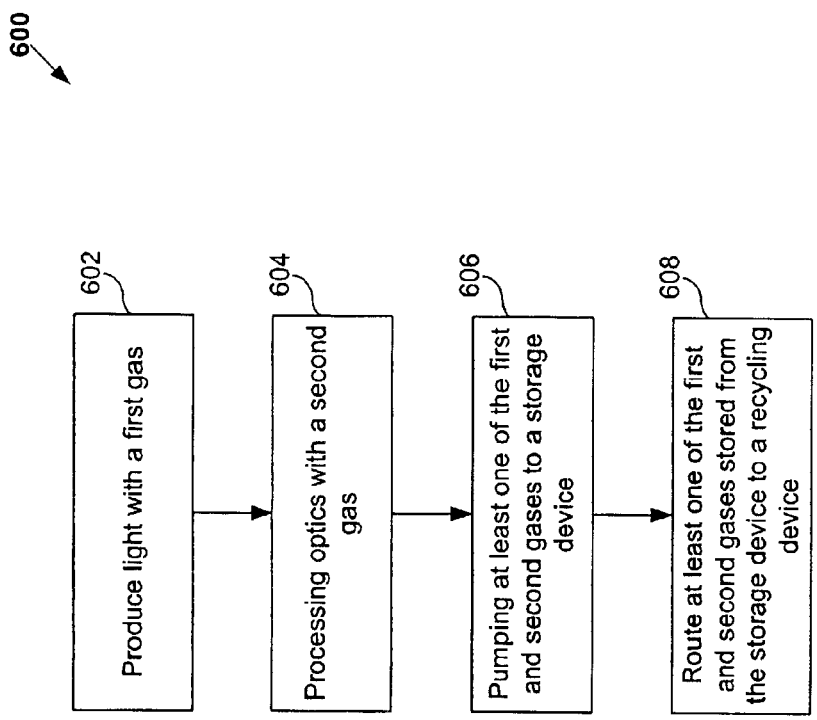
FIG. 6 shows a flowchart depicting a method according to an embodiment of the present invention.

FIG. 6 shows a flowchart depicting a method 600 according to an embodiment of the present invention. At step 602, light (e.g., extreme ultraviolet light) is produced with a first gas (e.g., xenon, lithium vapor, tin, krypton, and water vapor). At step 604, optics are processed (e.g., cleaned, protected, etc.) with a second gas (e.g., helium, argon, hydrogen, and nitrogen). It should be noted that step 602 and 604 may be occurring at the same time during an exposure process. At step 606, at least one of the first and second gases is transferred to a storage device. At step 608, at least one of the first and second gases stored in the storage device is recycled.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
    a gas supply that stores a first gas;
    a first chamber coupled to the gas supply, the first chamber including an element that produces light using the first gas;
    a pump that pumps the first gas into a storage device; and
    a recycling device that receives the first gas from the storage device and recycles the first gas.

2. The system of claim 1, further comprising:
    a controller that routes the first gas from the storage device to the recycling device and routes the recycled gas from the recycling device back to the gas supply.

3. The system of claim 1, wherein said first gas is selected from the group consisting of xenon, lithium vapor, tin, krypton, and water vapor.

4. The system of claim 1, wherein the pump and the recycling device are positioned outside the first chamber.

5. The system of claim 1, wherein the recycling device is located outside the system.

6. The system of claim 1, wherein the element emits extreme ultra violet light.

7. The system of claim 1, wherein the first chamber houses a plasma light source.

8. The system of claim 7, wherein the plasma light source produces extreme ultra violet light.

9. The system of claim 1, further comprising:
    a second chamber that includes a second gas and that is coupled to the first chamber, the second chamber receiving the produced light; and
    a gas lock formed with a third gas that flows between the first gas and the second gas in an area in which they converge.

10. The system of claim 9, wherein said third gas is selected from the group consisting of helium, neon, and nitrogen.

11. The system of claim 9, wherein:
    the pump pumps the first and third gas from the first chamber; and
    the recycling device separates the first gas from the third gas, such that the first gas is reused to form the produced light.

12. The system of claim 9, wherein the pump and the recycling device are positioned outside the first chamber.

13. The system of claim 9, wherein the recycling device is positioned outside the system.

14. A method, comprising:
    (a) producing light within a chamber of a lithography tool using a first gas;
    (b) pumping the first gas into a storage device coupled to the lithography tool; and
    (c) routing the first gas from the storage device to a recycling device.

15. The method of claim 14, wherein said first gas is selected from the group consisting of xenon, lithium vapor, tin, krypton, and water vapor.

16. The method of claim 14, further comprising:
    using a second gas to process optical elements in a chamber that receives the light produced by the first gas; and
    separating the first gas from the second gas with a third gas that flows between them.

17. The method of claim 16, wherein said third gas is selected from the group consisting of helium, neon, and nitrogen.

18. The method of claim 16, further comprising storing the third gas in the storage device.

19. The method of claim 18, further comprising separating the first gas from the third gas and recycling the first gas.

20. The method of claim 14, wherein said producing step (a) produces extreme ultra violet light.

21. The method of claim 16, wherein said processing step reduces contamination on the optical elements.

22. The method of claim 16, wherein said processing step protects the optical elements.

23. The method of claim 14, further comprising
using a second gas to process optical elements in a chamber that receives the light produced by the first gas; and
separating the first gas from the second gas and recycling the first gas.

24. The method according to claim 23, wherein the processing step comprises using a partial pressure of the second gas.

* * * * *